United States Patent
Barbul et al.

(10) Patent No.: US 11,137,253 B2
(45) Date of Patent: Oct. 5, 2021

(54) METHOD FOR MEASURING A BEHAVIOR OF A MEMS DEVICE

(71) Applicant: TDK CORPORATION, Tokyo (JP)

(72) Inventors: Andreas Barbul, Munich (DE); Wolfgang Pahl, Munich (DE)

(73) Assignee: TDK CORPORATION, Tokyo (JP)

( * ) Notice: Subject to any disclaimer, the term of this patent is extended or adjusted under 35 U.S.C. 154(b) by 53 days.

(21) Appl. No.: 16/500,908

(22) PCT Filed: Jul. 10, 2018

(86) PCT No.: PCT/EP2018/068649
§ 371 (c)(1),
(2) Date: Oct. 4, 2019

(87) PCT Pub. No.: WO2019/011909
PCT Pub. Date: Jan. 17, 2019

(65) Prior Publication Data
US 2020/0124419 A1 Apr. 23, 2020

(30) Foreign Application Priority Data
Jul. 12, 2017 (DE) .......................... 102017115667.4

(51) Int. Cl.
*G01C 19/5712* (2012.01)
*G01C 19/5719* (2012.01)
(Continued)

(52) U.S. Cl.
CPC ............ *G01C 19/5719* (2013.01); *B81B 7/02* (2013.01); *G01C 19/5712* (2013.01);
(Continued)

(58) Field of Classification Search
CPC ............ G01C 19/5712; G01C 19/5719; G01P 15/0802; G01P 15/18; G01P 21/00
See application file for complete search history.

(56) References Cited

U.S. PATENT DOCUMENTS 3,044,292 A * 7/1962 Matthews ............... G01M 7/04
73/667
3,180,131 A * 4/1965 Thompson ............... G01P 21/00
73/1.87
(Continued)

FOREIGN PATENT DOCUMENTS

CN 104019830 A 9/2014
CN 205691137 U 11/2016
(Continued)

OTHER PUBLICATIONS

Giacci, F. et al., "Signal Integrity in Capacitive and Piezoresistive Single- and Multi-Axis MEMS Gyroscopes under Vibrations," Microelectronics Reliability, vol. 75, Jun. 20, 2017, 10 pages.
(Continued)

*Primary Examiner* — David J Bolduc
(74) *Attorney, Agent, or Firm* — Slater Matsil, LLP

(57) ABSTRACT

A method for measuring a behavior of a MEMS device is disclosed. In an embodiment a method includes mounting the MEMS device to a testing apparatus that comprises a vibration source, wherein the MEMS device comprises a 6-axis or 9-axis inertial sensor, applying a vibration to the MEMS device by the vibration source and simultaneously moving the testing apparatus according to a predefined movement pattern, reading output data provided by the inertial sensor and comparing the output data to the predefined movement pattern and/or reading output data provided by the inertial sensor and calculating a frequency response curve of the inertial sensor.

14 Claims, 5 Drawing Sheets

(51) Int. Cl.
*B81B 7/02* (2006.01)
*G01P 15/08* (2006.01)
*G01P 15/18* (2013.01)

(52) U.S. Cl.
CPC .......... *G01P 15/0802* (2013.01); *G01P 15/18* (2013.01); *B81B 2201/0235* (2013.01); *B81B 2201/0242* (2013.01)

(56) References Cited

U.S. PATENT DOCUMENTS

| | | | | | |
|---|---|---|---|---|---|
| 3,557,628 | A * | 1/1971 | Tsukada | ................ | G01P 1/003 73/514.12 |
| 3,659,456 | A * | 5/1972 | Marshall | ................ | G01P 15/08 73/659 |
| 3,693,400 | A * | 9/1972 | Savit | ................ | G01V 13/00 73/1.85 |
| 4,188,816 | A * | 2/1980 | Mairson | ................ | F41G 7/00 73/1.38 |
| 4,199,990 | A * | 4/1980 | Valdois | ................ | G01P 15/0975 73/514.15 |
| 4,385,524 | A * | 5/1983 | Cappel | ................ | B04B 5/10 73/663 |
| 4,495,433 | A * | 1/1985 | Sheridan | ................ | G01P 21/00 310/329 |
| 5,224,380 | A * | 7/1993 | Paik | ................ | G01P 15/18 73/510 |
| 5,353,642 | A * | 10/1994 | Hasegawa | ................ | G01P 21/00 73/1.38 |
| 5,355,716 | A * | 10/1994 | Castelli | ................ | G01P 21/00 73/1.39 |
| 5,435,168 | A * | 7/1995 | Granere | ................ | G01P 21/00 73/1.84 |
| 5,644,087 | A * | 7/1997 | Liu | ................ | G01M 7/045 73/432.1 |
| 5,895,858 | A * | 4/1999 | Malone | ................ | G01M 7/06 73/1.38 |
| 6,190,032 | B1 * | 2/2001 | Choda | ................ | B01F 11/0014 366/208 |
| 6,310,605 | B1 * | 10/2001 | Rosenberg | ................ | G06F 3/011 345/157 |
| 6,443,013 | B1 * | 9/2002 | Smith | ................ | G01M 7/045 73/663 |
| 7,066,004 | B1 * | 6/2006 | Kohler | ................ | G01C 19/5719 702/88 |
| 8,256,265 | B2 * | 9/2012 | Kobayashi | ................ | G01P 15/08 73/1.38 |
| 8,464,571 | B1 * | 6/2013 | Sparks | ................ | G01P 21/00 73/1.38 |
| 9,829,374 | B2 * | 11/2017 | Kilpatrick | ................ | G01B 11/14 |
| 9,887,687 | B2 | 2/2018 | Whiston et al. | | |
| 2003/0084704 | A1 * | 5/2003 | Hanse | ................ | G01C 25/005 73/1.38 |
| 2005/0160785 | A1 * | 7/2005 | Umeda | ................ | G01P 21/00 73/1.39 |
| 2006/0195305 | A1 * | 8/2006 | LaFond | ................ | G01C 19/5719 703/2 |
| 2006/0243023 | A1 * | 11/2006 | Wong | ................ | G01B 17/00 73/1.15 |
| 2007/0024581 | A1 * | 2/2007 | Kim | ................ | G01P 15/18 345/156 |
| 2007/0073502 | A1 | 3/2007 | Umeda | | |
| 2007/0240486 | A1 * | 10/2007 | Moore | ................ | G01C 21/16 73/1.37 |
| 2008/0028823 | A1 * | 2/2008 | Samuels | ................ | G01P 21/00 73/1.37 |
| 2008/0173092 | A1 | 7/2008 | Hattori et al. | | |
| 2009/0078044 | A1 * | 3/2009 | Wang | ................ | G01H 11/08 73/514.34 |
| 2009/0182521 | A1 * | 7/2009 | Sill | ................ | G01P 21/02 702/104 |
| 2009/0272189 | A1 * | 11/2009 | Acar | ................ | G01C 19/574 73/504.16 |
| 2009/0288485 | A1 * | 11/2009 | Ell | ................ | G01P 3/44 73/504.03 |
| 2011/0000275 | A1 * | 1/2011 | Froman | ................ | G01P 21/00 73/1.38 |
| 2011/0260734 | A1 | 10/2011 | Liao et al. | | |
| 2011/0308296 | A1 * | 12/2011 | Sasso | ................ | G01M 7/06 73/1.77 |
| 2012/0139175 | A1 | 6/2012 | Lim | | |
| 2013/0239692 | A1 * | 9/2013 | Chen | ................ | G01C 25/005 73/662 |
| 2014/0052401 | A1 * | 2/2014 | Riley | ................ | G06F 1/1694 702/89 |
| 2014/0083160 | A1 * | 3/2014 | Flooks | ................ | G01P 21/00 73/1.38 |
| 2015/0033848 | A1 * | 2/2015 | Pechstedt | ................ | G01D 5/35332 73/497 |
| 2015/0260519 | A1 * | 9/2015 | Boysel | ................ | G01C 19/5769 257/415 |
| 2016/0219719 | A1 * | 7/2016 | Whiston | ................ | H03H 9/462 |
| 2016/0370403 | A1 * | 12/2016 | Merdassi | ................ | G01P 15/18 |
| 2017/0328712 | A1 * | 11/2017 | Collin | ................ | H03D 7/00 |
| 2018/0120126 | A1 * | 5/2018 | Garre | ................ | G01C 25/005 |
| 2018/0244515 | A1 * | 8/2018 | Rombach | ................ | B81B 3/0018 |
| 2018/0257688 | A1 * | 9/2018 | Carter | ................ | G08B 13/1654 |

FOREIGN PATENT DOCUMENTS

| | | |
|---|---|---|
| DE | 102016100821 A1 | 7/2016 |
| WO | 2016034940 A1 | 3/2016 |
| WO | 2017054868 A1 | 4/2017 |

OTHER PUBLICATIONS

Nekrasov, Y.A. et al., "MEMS Gyro Vibration Immunity and its Measurement with TIRA Shaker," 2015 IEEE International Instrumentation and Measurement Technology Conference Proceedings, May 11, 2015, 6 pages.

Roy, N. et al., "Listening through a Vibration Motor," University of Illinois at Urbana-Champaign; downloaded from http://synrg.csl.illinois.edu/vibraphone/paperdocs/VibraPhone_mobisys16.pdf on Sep. 25, 2019, 14 pages.

* cited by examiner

METHOD FOR MEASURING A BEHAVIOR OF A MEMS DEVICE

This patent application is a national phase filing under section 371 of PCT/EP2018/068649, filed Jul. 10, 2018, which claims the priority of German patent application 102017115667.4, filed Jul. 12, 2017, each of which is incorporated herein by reference in its entirety.

TECHNICAL FIELD

The present invention relates to a method for measuring a behavior of a MEMS device comprising an inertial sensor. The behavior of the MEMS device that is measured by this method may be a mechanical attenuation behavior in response to a vibration being applied to the MEMS device.

BACKGROUND

It is known that an inertial sensor, for example, a gyroscope, may provide unreliable data when a disturbance, e.g., vibration, is applied to the inertial sensor, in particular when the frequency of the disturbance is close to the resonance frequency of the inertial sensor. Due to the ongoing trend for further miniaturization, in most MEMS devices there is almost no space for damping material or structures outside of a MEMS device that may damp a vibration of the device. Thus, sound sources or other external vibration sources may cause a major malfunction of the MEMS device which can be difficult to counter with digital filters or sensor fusion algorithms alone.

For this reason, a MEMS device comprising a damping structure has been developed as disclosed in International Patent Application No. WO 2017/054868 A1. The damping structure is spring and air-based and requires almost no additional volume. It provides a fast attenuation of a vibration applied to a MEMS device. However, in view of the newly developed MEMS device comprising a damping structure, the need has arisen to measure the performance of the damping structure.

SUMMARY OF THE INVENTION

Embodiments provide a method that allows measuring the behavior of a MEMS device in a response to a vibration applied to the device. The method is particularly relevant for MEMS devices comprising a damping structure. However, the method can also be performed to evaluate other MEMS devices.

Embodiments provide a method for measuring a behavior of an MEMS device comprising a 6-axis or 9-axis inertial sensor is proposed which comprises the steps of:

mounting the MEMS device to a testing apparatus that comprises a vibration source, applying a vibration to the MEMS device by the vibration source and, simultaneously, moving the testing apparatus according to a predefined movement pattern, reading output data provided by the inertial sensor and comparing the output data to the predefined movement pattern.

Additionally or alternatively to step C, the method can further comprise the step D. Reading output data provided by the inertial sensor and calculating a frequency response curve of the inertial sensor.

Accordingly, the method allows evaluating the accuracy of the data recorded by the inertial sensor when a vibration is applied to the MEMS device. Thus, the method may help to evaluate if an inertial sensor is able to provide reliable data even when a vibration is applied to the MEMS device. The method may also help to evaluate a performance of a damping of the MEMS device.

A 6-axis inertial sensor can comprise a 3-axis gyroscope and a 3-axis accelerometer. Accordingly, the 6-axis inertial sensor can be configured to measure rotations and accelerations into three dimensions.

A 9-axis inertial sensor can comprise a 3-axis gyroscope, a 3-axis accelerometer and a 3-axis compass. Thus, the 9-axis inertial sensor can be configured to measure rotations and accelerations into three dimensions and, additionally, to measure an absolute position in three dimensions.

The inertial sensor may be part of an inertial measurement unit (IMU). An inertial measurement unit is an electronic device that measures and reports a body's specific force, angular rate, and sometimes the magnetic field surrounding the body, using a combination of accelerometers and gyroscopes, sometimes also magnetometers. An inertial measurement unit works by detecting linear acceleration using one or more accelerometers and rotational rate using one or more gyroscopes. Some also include a magnetometer which is commonly used as a heading reference. Typical configurations contain one accelerometer, one gyroscope, and magnetometer per axis for each of the three vehicle axes. The three axes are referred to as pitch, roll and yaw. The terms "pitch", "roll" and "yaw" are used in this context as common in flight dynamics which is the science of air-vehicle orientation and control in three dimensions. The angles of rotation in three dimensions about the vehicle's center of mass are known as roll, pitch and yaw. The inertial measurement unit may be configured for inertial measurements with respect to six or nine axes.

The inertial sensor may be any sensor suitable for measuring a linear or rotational movement or a linear or rotational acceleration. For example, the inertial sensor may be a gyroscope. The inertial sensor may comprise multiple sensors.

In step A the MEMS device is mounted to the testing apparatus. In this context, mounting may be defined as a temporary fixing. After the measurement has been completed, the MEMS device may be removed from the testing apparatus. In particular, multiple MEMS devices may be mounted to the testing apparatus simultaneously. Further, multiple MEMS devices may be measured simultaneously. Thus, the method is suitable for mass production wherein multiple MEMS devices are tested at the same time.

The testing apparatus may be any surface to which the MEMS device can be mounted. For example, the testing apparatus may be a printed circuit board or a measurement table. The testing apparatus may be moveable, in particular tiltable. The testing apparatus may be configured to be tilted with respect to more than one axis.

The vibration source may be a piezoelectric vibration source or an electromagnetic exciter. The vibration source may be configured to apply a continuous or a discontinuous vibration. The vibration source may be configured to apply a vibration with a well-known amplitude and frequency. The vibration source may be configured such that the amplitude and/or the frequency of the vibration can be amended during the measurement.

In step B, the MEMS device is moved according to a predefined movement pattern. The movement pattern may comprise a sequence of defined movements of the testing apparatus. For example, the predefined movement pattern may comprise tilting movements of the testing apparatus.

The testing apparatus may be tilted in different directions and with different angular rates.

As the predefined movement pattern is well-known, it is possible, in step C, to compare the movements calculated based on the output data provided by the inertial sensor with the actual movement which is known from the predefined movement pattern. Thus, step C may allow calculating an error by which the data provided by the inertial sensor deviate from the actual position. Step C may be performed by an evaluation unit outside of the MEMS device.

In step D, a frequency response curve of the inertial sensor is calculated based on output data provided by the inertial sensor. The frequency response curve describes the response of the inertial sensor to vibrations of different frequencies. The frequency response curve may provide information concerning the frequency dependency of deviations of a measurement provided by the inertial sensor from a correct value, wherein the deviation is caused by the vibration.

The method provides the advantage that it can be performed with an encapsulated MEMS device. Thus, no further manufacturing steps may be necessary after the measurement of the behavior. Instead, the measurement can be performed in a last step of a final testing after the manufacturing process is completed.

The method can be performed simultaneously for many MEMS devices. Moreover, the method can be performed very fast. Thus, the method is adapted for a mass production of MEMS devices.

The testing apparatus may comprises a 3-axis accelerometer configured to measure a frequency of a vibration applied to the MEMS device, wherein, in step B, the frequency of the applied vibration is varied, and wherein, in step D, the frequency response curve is calculated based on the output data by the inertial sensor (2) and the data provided by the 3-axis accelerometer.

The 3-axis accelerometer may have a resonance frequency which differs from the resonance frequency of a 3-axis gyroscope of the inertial sensor. Thus, the 3-axis accelerometer may not be significantly affected by a vibration having a frequency which corresponds to the resonance frequency of the 3-axis gyroscope.

In step C, a software algorithm may determine whether the difference between the output data provided by the inertial sensor and the predefined movement pattern is within a predetermined acceptance limit. Thus, the method allows checking if a MEMS device fulfils a customer requirement regarding robustness against disturbances. The roll angles measured by the inertial sensor should not be affected during tilting of the MEMS device if the MEMS device is working inside the customer requirements. MEMS devices that do not fulfil such requirements may be rejected in a final testing after a manufacture process is completed.

According to the predefined movement pattern, the testing apparatus may be tilted at a defined angular rate in different directions during step B, wherein a roll angle and a pitch angle may be calculated based on the output data provided by the inertial sensor in step C. The roll angle and the pitch angle may define the orientation of a rotation axis.

In step C, the output data provided by the inertial sensor may be evaluated using a sensor fusion algorithm comprising a Kalman filter before comparing the output data to the predefined movement pattern. The sensor fusion algorithm may be suitable for removing an error in the measurement of the inertial sensor. The Kalman filter may be a digital Kalman filter. Using a sensor fusion algorithm comprising a Kalman filter may significantly increase the accuracy in the measurement results determined by the inertial sensor. In particular, for vibrations having a rather small amplitude, the sensor fusion algorithm may be able to remove the effect of the vibration almost completely.

The inertial sensor may comprise a gyroscope. Gyroscopes tend to be sensitive to disturbances that appear in a frequency close to the gyroscopes resonance frequency. The gyroscope may have different resonance frequencies with respect to different axes.

The inertial sensor may be resiliently mounted on a carrier by means of a spring element wherein an airgap is provided between a top surface of the carrier and a bottom surface of the inertial sensor, wherein a damping structure is applied to at least one surface chosen from a first surface located on the carrier and a second surface located on the inertial sensor. Accordingly, a damping of the inertial sensor may be spring and air-based. The spring element may comprise a metal, e.g., copper, or a silicon material. In particular, the MEMS device may comprise a damping structure as disclosed in WO 2017/054868 A1.

The method is particularly suitable for MEMS devices comprising a damping structure as the method may allow evaluating the quality of the damping. However, it may also be interesting to measure the effect of a vibration applied to a MEMS device which does not comprise a damping structure.

The damping structure may be applied as a layer between the inertial sensor and the carrier on one of the first and second surface, wherein the layer comprises recesses and wherein the recesses are at least measured to accommodate the spring elements. The spring elements may comprise an elongated structure that is linear, bent or angled, a first end of the extended structure being coupled to a first anchor point on the carrier and a second end of the extended structure being coupled to a second anchor point on the sensor system, wherein the height of the airgap normal to the surface is smaller than the distance normal to the surface between first and second anchor point. Thus, the damping structure may be arranged to reduce the width of the airgap.

The inertial sensor may be encapsulated in a sealed package. The method can be performed with an encapsulated MEMS device. No opening in the package is required for performing the measurement of the behavior. Thus, no further manufacturing steps may be necessary after the method has been performed. Instead, the method can be performed after a manufacturing process has been completed.

Multiple MEMS devices can be mounted to the testing apparatus in step A, wherein the behavior of the multiple MEMS devices is measured simultaneously in steps B and C. The method is suitable for a mass production.

The vibration applied in step B may be continuous or discontinuous. When the vibration is applied discontinuously, it can be measured how fast the MEMS device returns to its normal operation mode, i.e., how effective a damping structure can attenuate a vibration of the MEMS device. If the vibration is applied continuously, it can be evaluated if the MEMS device is functional even under vibration. Thus, the tolerance of the device to vibration can be determined.

The testing apparatus can be rotated at an angular rate in the range of 0.001 degrees/second to 1000 degrees/second during step B. The rate can be changed during step B.

The vibration source may vibrate with a frequency in the range of 0.1 kHz to 1000 kHz during step B, preferably in the range of 19 to 80 kHz and more particularly in the range of 20 to 35 kHz. This frequency range is typical for the resonance frequency of an inertial sensor. Measurements with a vibration having a frequency close to the resonance frequency of the sensor are particularly relevant. The frequency of the vibration can also be adapted to higher frequencies, like an integer multiple of the resonance frequency of one gyroscope or different gyroscopes in one package so as to reach the range of special harmonics of the MEMS device or multiple devices in one package.

The vibration source can vibrate with an amplitude in the range of 1 nm to 10 μm during step B. The amplitude and frequency of the vibration may change during step B.

The testing apparatus is moved during step B such that the g-rate in the range of 0.01 g to 100 g is applied to the MEMS device. Preferably, the rate is between 0.5 g to 10 g. A g-rate of more than 100 should not be applied as; otherwise, the inertial sensor may be damaged by the g-force. A g-rate below 0.01 should not be applied as it may be difficult to measure such low g-forces with a sufficient accuracy.

The method may be performed to evaluate MEMS devices intended for all kinds of purposes. For example, the MEMS device may be used in consumer products, e.g., a smart cellphone or a civilian drone. In smart cellphones and civilian drones, inertial sensors are used to determine an orientation of the respective device. Smart cellphones often comprise powerful vibration sources, e.g., speakers. Civilian drones may be used in environments with acoustic noise which may result in vibrations of the drone. Thus, for consumer products like cellphones and civilian drones, it is crucial to know if an inertial sensor provides reliable data when a vibration is applied to the consumer product.

The MEMS device may also be used in an electronic component used for an automotive application. For example, a gyroscope may be used for movement tracking in an automotive application. Ultrasound haptic feedback may occur in the automotive application which may result in a vibration of the MEMS device.

Inertial sensors, for example gyroscopes, may be used for detecting acoustically caused vibrations, for example, speech.

Furthermore, the MEMS device may also be used in a high value device, for example, in a rocket, an airplane, a drone for military or aerospace purposes. In such high value devices, it is also important to know how the MEMS device responds to a vibration.

Further embodiments provide a method for measuring the behavior of an MEMS device comprising an inertial sensor, wherein the method comprises the step of applying a vibration to the inertial sensor and measuring the attenuation of the vibration using a laser Doppler vibrometer. The method using the laser Doppler vibrometer is more complicated and is less suitable for mass production than the method according to the first aspect. However, it may provide an improved accuracy. In a mass production of a multitude of MEMS devices, a measurement of the behavior using a laser Doppler vibrometer may be performed for a control sample comprising only a small number of MEMS devices.

In order to perform this method, it has to be ensured that a laser beam can be applied to the inertial sensor. The MEMS device may comprise a cap which seals the inertial sensor, wherein the cap is transparent for a laser beam used in the laser Doppler vibrometer. Alternatively, the MEMS device may comprise a cap which covers the inertial sensor, wherein the cap has one or more holes, wherein a laser beam is applied to the inertial sensor through one of the holes, wherein the one or more holes are sealed after measuring the attenuation of the vibration.

BRIEF DESCRIPTION OF THE DRAWINGS

In the following, the present invention is described in detail with reference to the figures.

DETAILED DESCRIPTION OF ILLUSTRATIVE EMBODIMENTS

Figure 1:
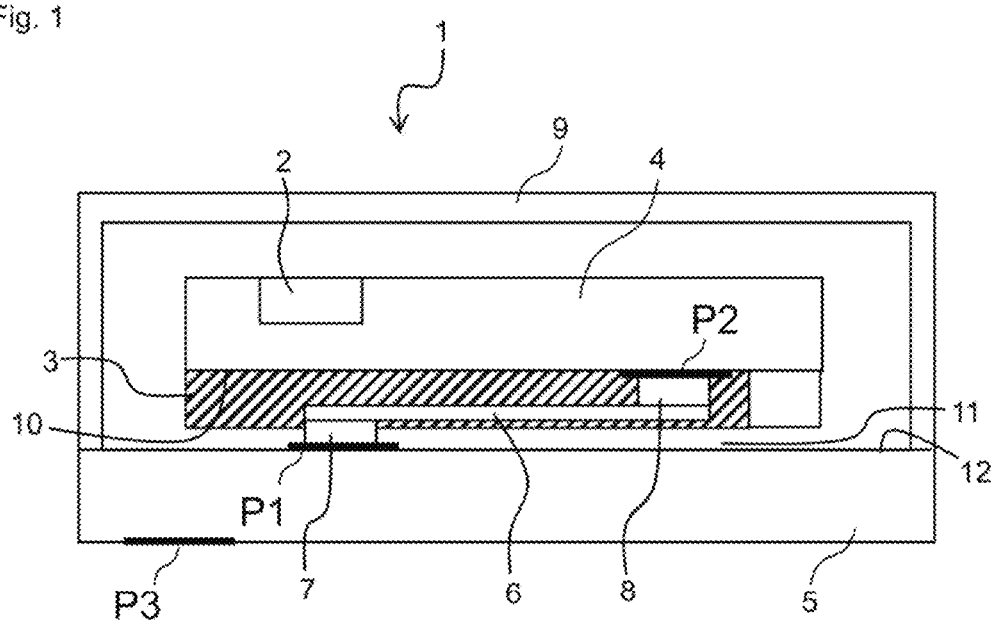
FIGS. 1 and 2 show MEMS devices comprising a damping structure.
Figure 2:
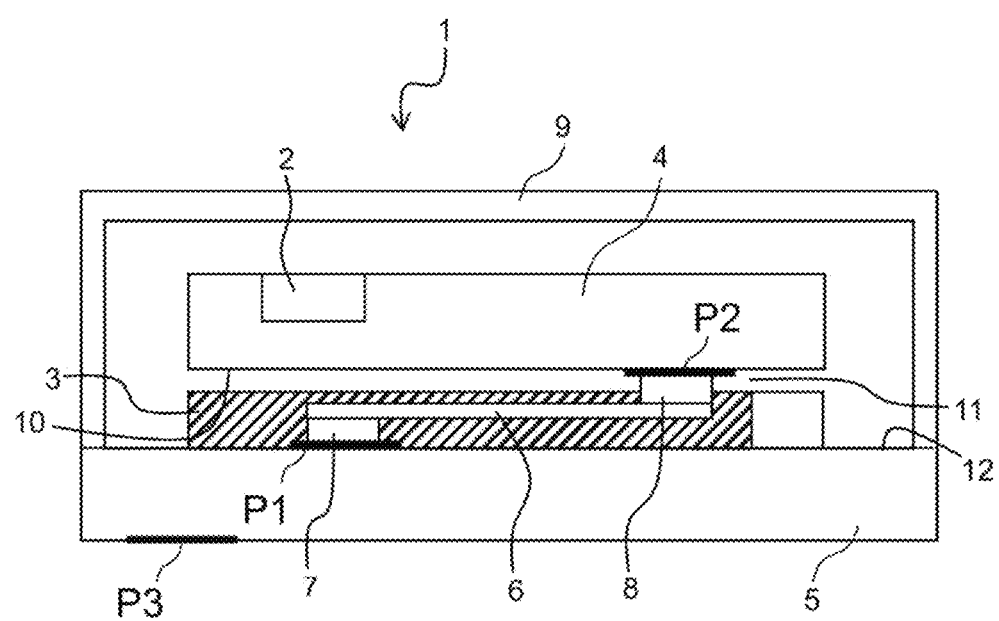

A method for measuring a behavior of a MEMS device 1 comprising an inertial sensor 2 is disclosed. The behavior may, in particular, be a mechanical attenuation behavior in response to a vibration applied to the MEMS device 1. Such a measurement is particularly relevant for a MEMS device 1 which comprises a damping structure 3 configured to attenuate a vibration of the inertial sensor 2. FIGS. 1 and 2 show such a MEMS device 1.

It is the purpose of the measurement to evaluate the performance of the MEMS device 1 when the MEMS device 1 is subjected to a mechanical disturbance, e.g., a vibration. The measurement is designed to determine if the inertial sensor 2 can provide reliable information even if a vibration is applied to the MEMS device 1. Moreover, the measurement is designed to determine an attenuation of a vibration of the MEMS device 1. For example, the measurement setup is designed to determine how long it takes, after the disappearance of a disturbance in form of a vibration, until the inertial sensor 2 provides reliable data again. Thus, these measurements may allow evaluating the performance of the damping structure 3 and/or of a sensor fusion algorithm.

FIG. 1 shows a cross section through the MEMS device 1. The device 1 comprises an inertial measurement unit 4 that comprises the inertial sensor 2. The MEMS device 1 may also comprise a pressure sensor or a microphone. The inertial measurement unit 4 is resiliently mounted onto a carrier 5 via spring elements 6. The spring elements 6 may comprise a stand-off 7 on the carrier 5 and a free standing end laterally extending therefrom. The inertial measurement unit 4 is bonded to the free standing end by means of bumps 8. Via the spring element 6, stand-off 7 and bump 8 electrical contact between second electrical contacts P2 on a bottom surface 10 of the inertial measurement unit 4 and first electrical contacts P1 on the carrier 5 is achieved.

The carrier 5 may be a multilayer printed circuited board that may have a multilayer structure comprising at least one wiring layer and other internal wiring connecting the first electrical contacts P1 to external contacts P3 of the MEMS device 1 on a bottom surface of the carrier.

A cap 9 is bonded to a top surface 12 of the carrier 5 via a glue or solder. Between cap 9 and carrier 5 a volume is enclosed accommodating at least the inertial measurement unit 4. The volume may be necessary for the function of the MEMS device 1 and may provide protection against chemical and mechanical impact from the environment. For clarity reasons only the inertial measurement unit 4 comprising the inertial sensor 2 is shown. But other components of the MEMS device 1 like an ASIC, for example, may be accommodated too under the cap 9.

An external shock may be able to induce a resonance of the inertial measurement unit 4. This resonance may saturate the inertial sensor 2 and disturb its sensing function. In order to prevent such a disturbance, the MEMS device 1 comprises a damping structure 3. In the embodiment shown in FIG. 1, the damping structure 3 is applied to the bottom surface 10 of the inertial measurement unit 4. The damping structure 3 comprises recesses to accommodate the spring elements 6. Thereby the airgap 11 between the bottom surface 10 of the inertial measurement unit 4 and the top surface 12 of the carrier 5 is reduced. As the spring elements 6 are mounted to an anchor point on the bottom surface 10 of the inertial measurement unit 4 "below" the damping structure 3 the maximum mutual movement of inertial measurement unit 4 versus carrier 5 is limited by the air gap 11 between top surface 12 of carrier 5 and a bottom surface of the damping structure 3. The air gap 11 is reduced with regard to a device which does not comprise a damping structure 3. The height of the air gap 11 is set to a value small enough that squeeze film damping occurs.

FIG. 2 shows a cross section of a MEMS device 1 according to a second embodiment of the invention. Different from the first embodiment of FIG. 1, the damping structure 3 is applied to the top surface 12 of the carrier 5. The thus reduced air gap 11 is formed between a top surface on the damping structure 3 and the bottom surface 10 of the inertial measurement unit 4. The same effect is achieved by this embodiment as the same squeeze film damping occurs at this air gap 11.

Figure 3:
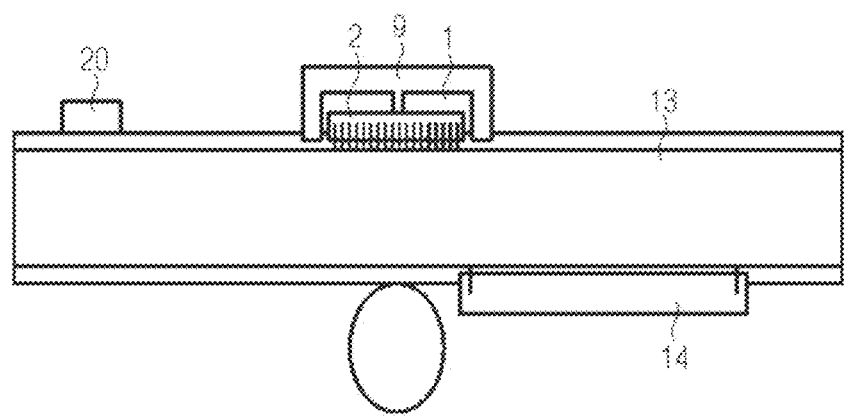
FIG. 3 shows a setup for performing a measurement of a behavior of a MEMS device.

FIG. 3 shows a measurement setup which enables a measuring of the mechanical attenuation behavior of a MEMS device 1. The measurement setup comprises a testing apparatus 13. The testing apparatus 13 may be a measurement table or a printed circuit board.

The MEMS device 1 is mounted to surface of the testing apparatus 13, for example, to a top surface. Further, the measurement setup comprises a vibration source 14 which is fixed to the testing apparatus 13. According to the embodiment shown in FIG. 3, the vibration source 14 is mounted to a bottom surface opposite to the top surface of the testing apparatus 13. Alternatively, the vibration source 14 may also be mounted to the top surface of the testing apparatus 13. The vibration source 14 is configured to apply a vibration to the testing apparatus 13. The vibration source 14 may be an electromechanical exciter or a piezoelectric vibration source.

The testing apparatus 13 is configured to be moved according to a predefined movement pattern. In particular, the testing apparatus 13 is configured to be tilted relative to one axis or to be tilted relative to multiple axis. In particular, according to the predefined movement pattern, the testing apparatus 13 is tilted at a defined angular rate in different directions. This predefined movement pattern is well-known with a high precision.

The MEMS device 1 comprises the inertial sensor 2. In particular, the MEMS device 1 may comprise the inertial measurement unit 4 configured to measure inertial movements with respect to six or nine axes. The inertial sensor 2 may comprise one or more gyroscopes. In particular, the MEMS device 1 may be the device shown in FIG. 1 or the device shown in FIG. 2.

For measurement of the behavior of the MEMS device 1, a vibration is applied to the testing apparatus 13 and, thereby, to the MEMS device 1 by the vibration source 14. At the same time, the MEMS device 1 is moved according to the predefined movement pattern.

The output data provided by the inertial sensor 2 are read out and compared to the predefined movement pattern. This allows determining an error which results from the vibration being applied to the MEMS device 1.

The output data provided by the inertial sensor 2 are analyzed and a software algorithm determines whether the deviation of the output data from the predefined movement pattern is within a predefined acceptance limit. This allows determining whether the MEMS device 1 has an attenuation behavior that is within given customer specifications.

The output data provided by the inertial sensor 2 may first be evaluated in a sensor fusion algorithm comprising a Kalman filter. The sensor fusion algorithm may be carried out in the ASIC inside the MEMS device 1. Alternatively, raw output data provided by the inertial sensor 2 may be applied to an evaluation unit outside of the MEMS device 1 and the sensor fusion algorithm may be performed in the evaluation unit outside of the MEMS device 1.

The testing apparatus 13 further comprises a 3-axis accelerometer 20.

Figure 4:
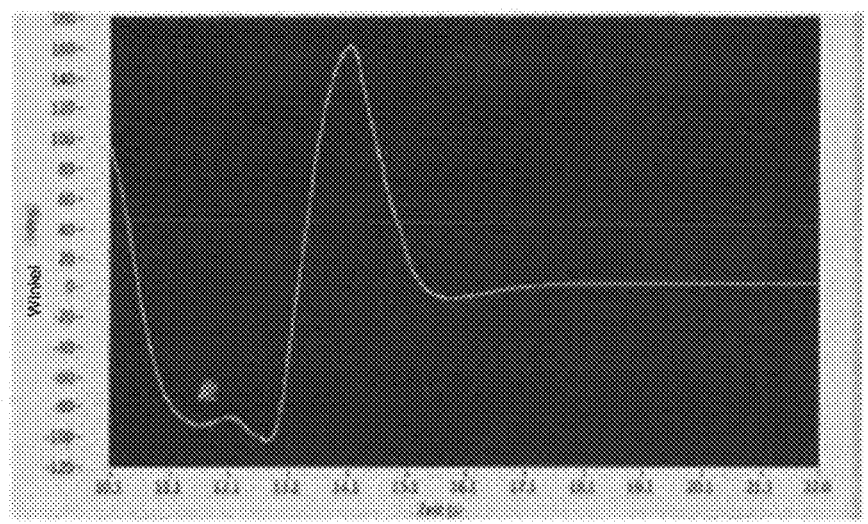
FIGS. 4 to 8 show results of different measurements.

FIG. 4 shows an example of the output data provided by the MEMS device 1 in response to a movement of the testing apparatus 13 and a simultaneous vibration being applied by the vibration source 14. The output data shown in FIG. 4 are the output data provided by the sensor fusion algorithm wherein the raw data provided by the inertial sensor 2 have been evaluated using a Kalman filter. On the horizontal axis, a time after the start of the measurement in seconds is shown. On the vertical axis, the angle of rotation as calculated from the output data is shown wherein the output data have been evaluated using a sensor fusion algorithm.

It can be seen in FIG. 4 that the output data result in a rather smooth curve. Thus, the data show that the inertial sensor 2 was able to perform a reliable measurement even when the MEMS device 1 is vibrated.

Figure 5:
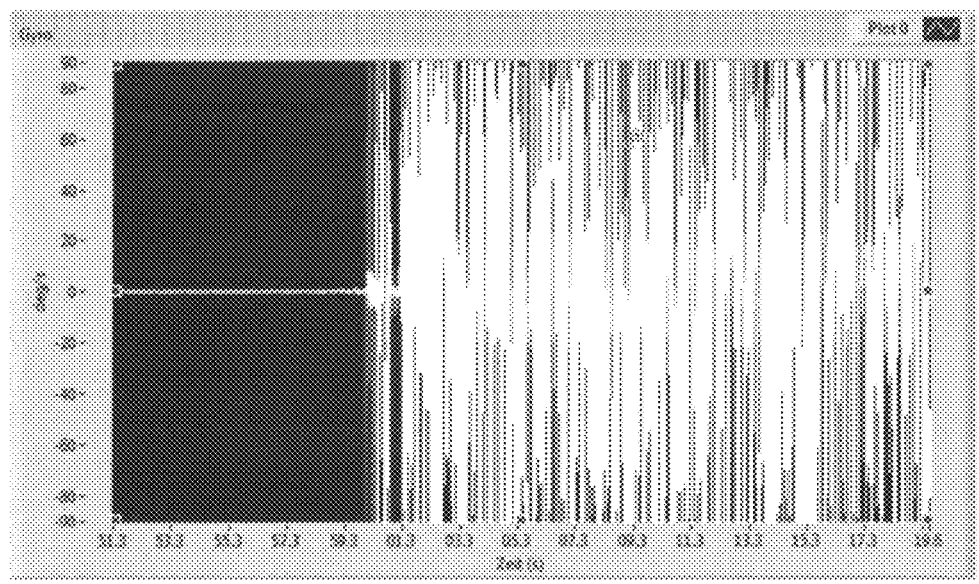

FIG. 5 shows the result of another measurement. On the horizontal axis, a time after the start of the measurement in seconds is shown. On the vertical axis, the angle of rotation as calculated from the output data is shown wherein the raw output data are shown which have not been evaluated using a sensor fusion algorithm. The inertial sensor 2 is a gyroscope. It is clearly visible in the data shown in FIG. 5 that a vibration has been applied with the resonance frequency of the inertial sensor 2 at the time of 0.0 seconds. Due to the resonance behavior of the gyroscope, the raw data provided by the inertial sensor 2 shown a large error and cannot be considered as being reliable.

Figure 6:
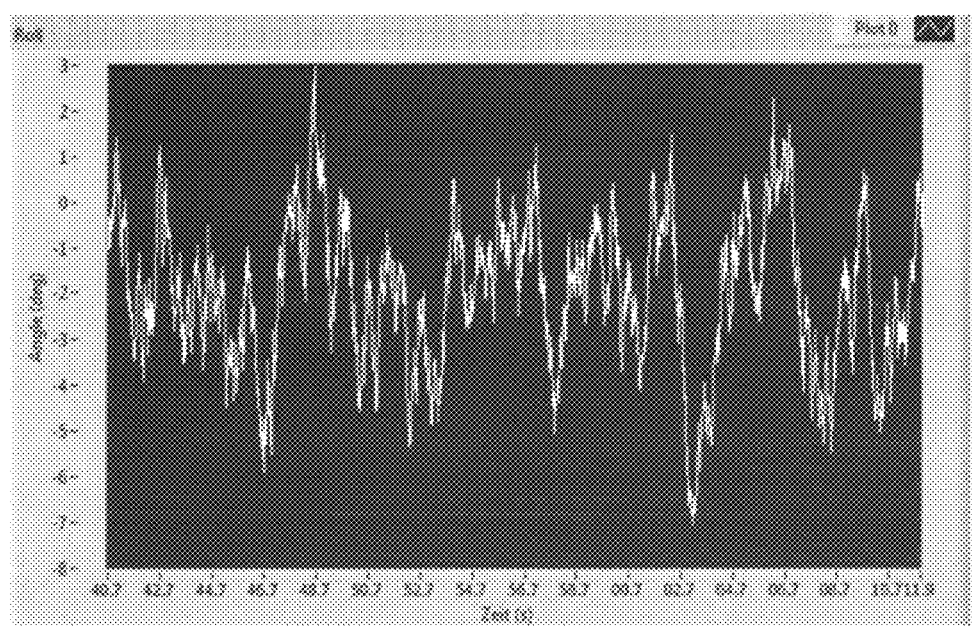

FIG. 6 shows the result of another measurement wherein a MEMS device 1 has been moved according to a predefined movement pattern and, simultaneously, vibrated. On the horizontal axis, a time after the start of the measurement in seconds is shown. On the vertical axis, a difference between the roll angle of the testing apparatus 13 which is known in the predefined movement pattern and the roll angle as calculated by a sensor fusion algorithm is shown. It is shown in FIG. 6 that the roll angle as calculated by the sensor fusion algorithm deviates from the actual roll angle up to −7°. This deviation is due to resonance effects. Thus, this measurement shows that a damping provided by the damping structure was not strong enough to guarantee reliable data in this case.

Figure 7:
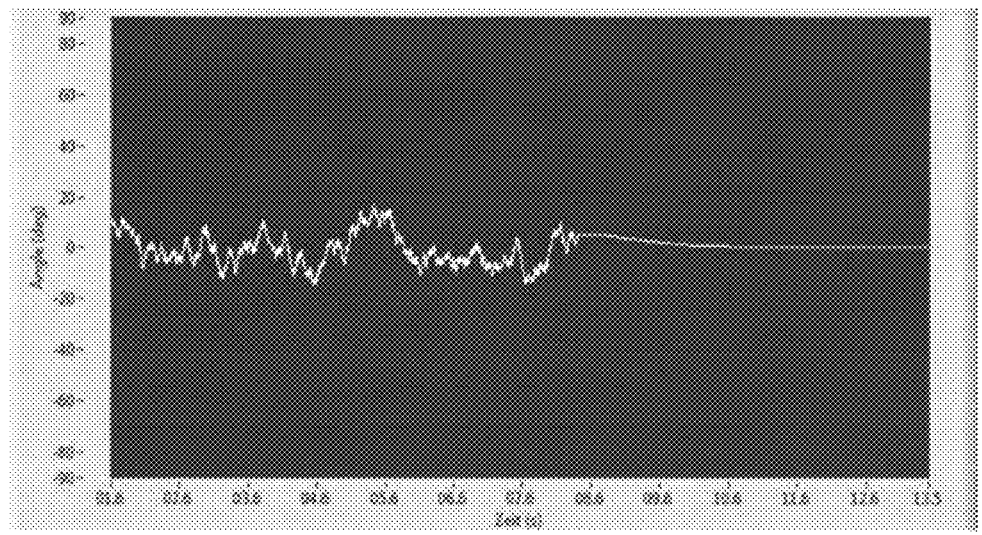
Figure 8:
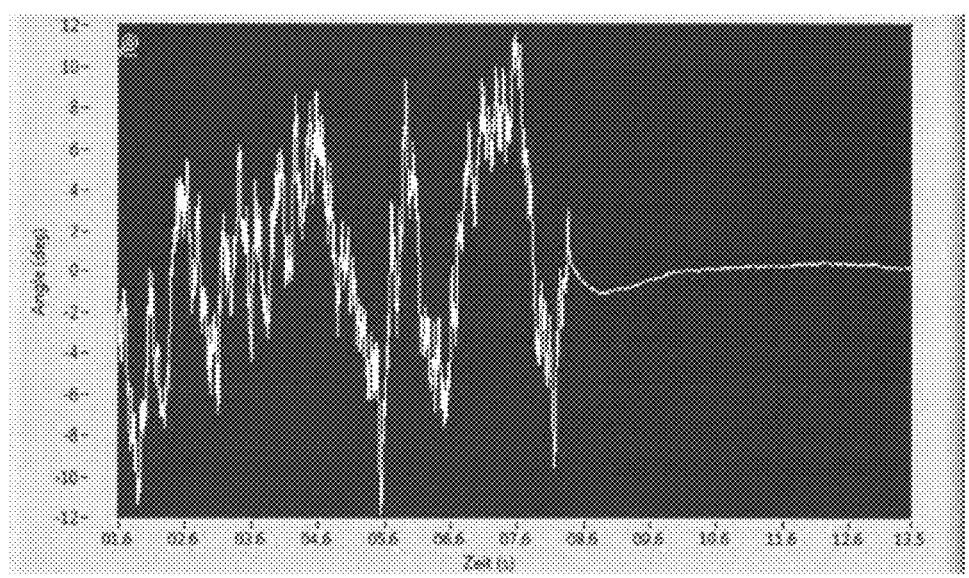

FIGS. 7 and 8 show the result of another measurement of this kind. In FIGS. 7 and 8, the same measurement is shown; only the scale of the respective vertical axis differs. Again, a time after the start of the measurement in seconds is shown on the respective horizontal axis. On the vertical axis, a difference between the roll angle of the measurement table which is known in the predefined movement pattern and the roll angle as calculated by a sensor fusion algorithm is shown.

A vibration has been applied form the start of the measurement at 0.0 seconds until 8.5 seconds. It can be seen in both figures that, after the vibration stops, the inertial sensor is damped very fast and provides reliable data less than 0.1 seconds after the end of the vibration. Thus, the measurement allows determining the performance of the damping structure.

The above-described measurement can be performed simultaneously for multiple MEMS devices 1. In particular, multiple MEMS devices 1 can be mounted onto the testing apparatus 13 and evaluated simultaneously. Thus, the measurement is suitable for a mass production of a multitude of MEMS devices 1. The measurement may be performed after a manufacturing process of the multitude of MEMS devices 1 has been completed as part of a performance and reliability test of the MEMS devices 1.

In particular, the measurement can be performed after the MEMS device 1 has been encapsulated with the cap 9. Accordingly, no further production steps have to be performed after the measurement which could, otherwise, influence the damping behavior.

The measurement can be performed and evaluated very fast. This also helps to enable the measurement for mass production of multiple MEMS devices 1.

Figure 9:
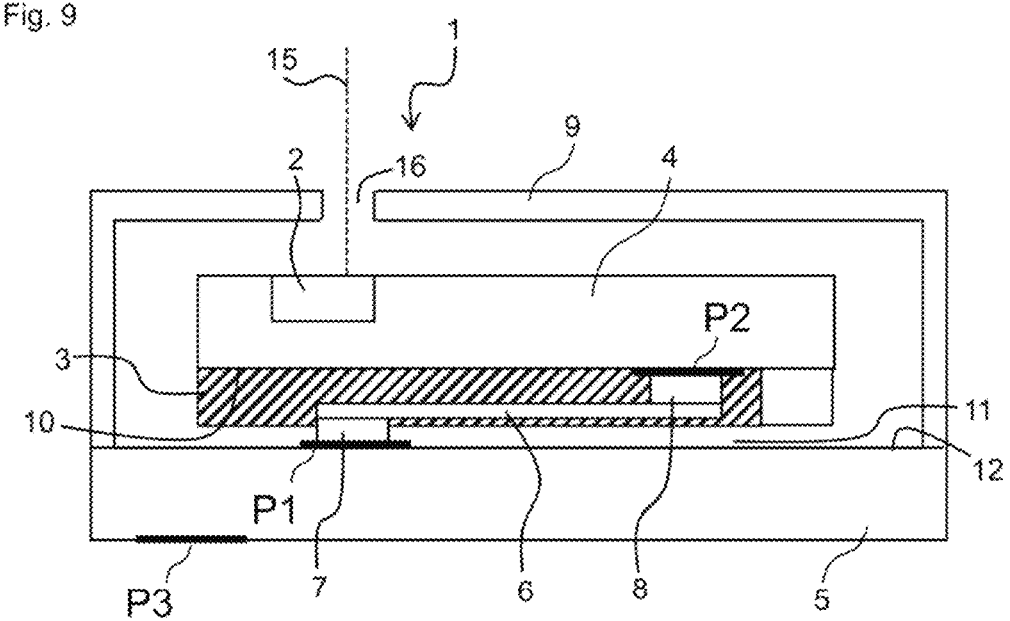
FIG. 9 shows another method of measuring the behavior of a MEMS device.

FIG. 9 shows another method of measuring the behavior of the MEMS device 1. First, a vibration is applied to the MEMS device 1. Further, a laser beam 15 is applied to the inertial sensor 2. The vibration of the inertial sensor 2 is determined by a laser Doppler vibrometer using the laser beam 15. The cap 9 comprises a hole 16 wherein the laser beam 15 can access the inertial sensor 2 through the hole 16. In an alternative embodiment, the cap 9 is transparent for the laser beam 15.

We claim:

1. A method for measuring a behavior of a MEMS device, the method comprising:
   mounting the MEMS device to a testing apparatus that comprises a vibration source, wherein the MEMS device comprises a 6-axis or 9-axis inertial sensor;
   applying a vibration to the MEMS device by the vibration source and simultaneously moving the testing apparatus according to a predefined movement pattern;
   reading output data provided by the inertial sensor and comparing the output data to the predefined movement pattern; and/or
   reading output data provided by the inertial sensor and calculating a frequency response curve of the inertial sensor,
   wherein moving the testing apparatus according to the predefined movement pattern comprises tilting the testing apparatus at a defined angular rate in different directions, and
   wherein reading output data provided by the inertial sensor comprises calculating a roll angle and a pitch angle based on the output data provided by the inertial sensor.

2. The method according to claim 1,
   wherein the testing apparatus comprises a 3-axis accelerometer configured to measure a frequency of the applied vibration,
   wherein the frequency of the applied vibration is varied, and
   wherein the frequency response curve is calculated based on the output data by the inertial sensor and data provided by the 3-axis accelerometer.

3. The method according to claim 1, wherein comparing the output data to the predefined movement patter comprises determining, by a software algorithm, whether a difference between the output data provided by the inertial sensor and the predefined movement pattern is within a predetermined acceptance limit.

4. The method according to claim 1, wherein the output data provided by the inertial sensor are evaluated using a sensor fusion algorithm comprising a Kalman filter before comparing the output data to the predefined movement pattern.

5. The method according to claim 1, wherein the inertial sensor comprises a gyroscope.

6. The method according to claim 1,
   wherein the inertial sensor is resiliently mounted on a carrier by spring elements,
   wherein an air gap is provided between a top surface of the carrier and a bottom surface of the inertial sensor, and
   wherein a damping structure is applied to at least one surface chosen from a first surface located on the carrier or a second surface located on the inertial sensor.

7. The method according to claim 6,
   wherein the damping structure is applied as a layer between the inertial sensor and the carrier on one of the first surface or the second surface,
   wherein the layer comprises recesses, and
   wherein the recesses are at least measured to accommodate the spring elements.

8. The method according to claim 6,
   wherein the spring elements comprise an extended structure that is linear, bent or angled,
   wherein a first end of the extended structure is coupled to a first anchor point on the carrier,
   wherein a second end of the extended structure is coupled to a second anchor point on a sensor system, and
   wherein a height of the air gap normal to the surface is smaller than a distance normal to the surface between first and second anchor point.

9. The method according to claim 1, wherein the inertial sensor is encapsulated in a sealed package.

10. The method according to claim 1, wherein mounting the MEMS device comprises mounting a plurality of MEMS devices to the testing apparatus, and wherein the behavior of the plurality of MEMS devices is measured simultaneously.

11. The method according to claim 1, wherein applying the vibration to the MEMS device by the vibration source comprises applying the vibration continuously.

12. The method according to claim 1, wherein applying the vibration to the MEMS device by the vibration source comprises applying the vibration discontinuously.

13. The method according to claim 1, wherein moving the testing apparatus comprises rotating the testing apparatus at an angular rate in a range of 0.001 deg/s to 1000 deg/s.

14. The method according to claim 1, wherein applying the vibration to the MEMS device by the vibration source comprises vibrating the vibration source with a frequency in a range of 0.1 kHz to 1000 kHz and with an amplitude in a range of 1 nm to 10 μm.

* * * * *